(12) United States Patent
Buettgen et al.

(10) Patent No.: US 7,671,671 B2
(45) Date of Patent: Mar. 2, 2010

(54) DEVICE AND METHOD FOR THE DEMODULATION OF MODULATED ELECTRIC SIGNALS

(75) Inventors: Bernhard Buettgen, Adliswil (CH); Michael Lehmann, Winterthur (CH); Simon Neukom, Uster (CH); Thierry Oggier, Zurich (CH); Felix Lustenberger, Cham (CH)

(73) Assignee: MESA Imaging AG, Zurich (CH)

( * ) Notice: Subject to any disclaimer, the term of this patent is extended or adjusted under 35 U.S.C. 154(b) by 33 days.

(21) Appl. No.: 12/090,433

(22) PCT Filed: Oct. 5, 2006

(86) PCT No.: PCT/CH2006/000546

§ 371 (c)(1), (2), (4) Date: Apr. 16, 2008

(87) PCT Pub. No.: WO2007/045107

PCT Pub. Date: Apr. 26, 2007

(65) Prior Publication Data

US 2008/0247033 A1 Oct. 9, 2008

(30) Foreign Application Priority Data

Oct. 19, 2005 (EP) .................... 05405589

(51) Int. Cl.
*G01R 25/00* (2006.01)
*H03D 13/00* (2006.01)
*H03K 17/693* (2006.01)

(52) U.S. Cl. .................... 329/345; 257/215; 327/9; 327/416

(58) Field of Classification Search ......... 329/345–346; 257/215; 327/2–10, 414–418
See application file for complete search history.

(56) References Cited

U.S. PATENT DOCUMENTS

| 3,965,368 A | 6/1976 | Emmons |
| 4,241,451 A | 12/1980 | Maixner et al. |

(Continued)

FOREIGN PATENT DOCUMENTS

DE 4440613 C1 7/1996

(Continued)

OTHER PUBLICATIONS

European Search Report from Application No. EP 05 40 5589, filed Oct. 19, 2005, dated May 8, 2006.

(Continued)

*Primary Examiner*—David Mis
(74) *Attorney, Agent, or Firm*—Houston Eliseeva LLP

(57) ABSTRACT

A demodulation device (1) in semiconductor technology is disclosed. The device (1) is capable of demodulating an injected modulated current. The device (1) comprises an input node (IN1), a sampling stage (DG1, IG1, GS1, IG2, DG2) and at least two output nodes (D1, D2). The sampling stage DG1, IG1, GS1, IG2, DG2) comprises transfer means (GL, GM, GR) for transferring a modulated charge-current signal from the input node (IN1) to one of the output nodes (D1, D2) allocated to the respective time interval within the modulation period. The small size and the ability to reproduce the device (1) in standard semiconductor technologies make possible a cost-efficient integration of the device (1).

31 Claims, 14 Drawing Sheets

U.S. PATENT DOCUMENTS

| | | | |
|---|---|---|---|
| 4,344,040 A | | 8/1982 | Reilly et al. |
| 4,371,953 A | | 2/1983 | Hyatt |
| 4,389,615 A | * | 6/1983 | French et al. ............... 329/305 |
| 4,603,436 A | | 7/1986 | Butler |
| 4,779,054 A | | 10/1988 | Monteleone et al. |
| 4,982,193 A | | 1/1991 | Saul |
| 5,614,862 A | * | 3/1997 | Sun ........................... 329/341 |
| 5,767,726 A | | 6/1998 | Wang |
| 5,841,811 A | | 11/1998 | Song |
| 5,856,667 A | | 1/1999 | Spirig et al. |
| 2006/0108611 A1 | | 5/2006 | Seitz |
| 2007/0187724 A1 | | 8/2007 | Kaufmann et al. |

FOREIGN PATENT DOCUMENTS

| | | |
|---|---|---|
| EP | 0837556 A1 | 4/1998 |
| EP | 1583150 A1 | 10/2005 |
| EP | 1624490 A1 | 2/2006 |
| GB | 2389960 A | 12/2003 |
| WO | 97/12371 A1 | 4/1997 |

OTHER PUBLICATIONS

International Search Report from International Application No. PCT/CH2006/000546, filed Oct. 5, 2006, mailed on Dec. 5, 2006.

Lattes, A. L. et al., "Ultrafast Shallow-Buried-Channel CCD's with Built-in Drift Fields," IEEE Electron Device Letters, vol. 12, No. 3, Mar. 1991, pp. 104-107.

Sullivan, P. J. et al., "Doubly Balanced Dual-Gate CMOS Mixer," IEEE Journal of Solid State Circuits, vol. 34, No. 6, Jun. 1999, pp. 878-881.

Preliminary Report on Patentability from PCT/CH2006/000546, filed Oct. 5, 2006, dated May 5, 2008.

* cited by examiner

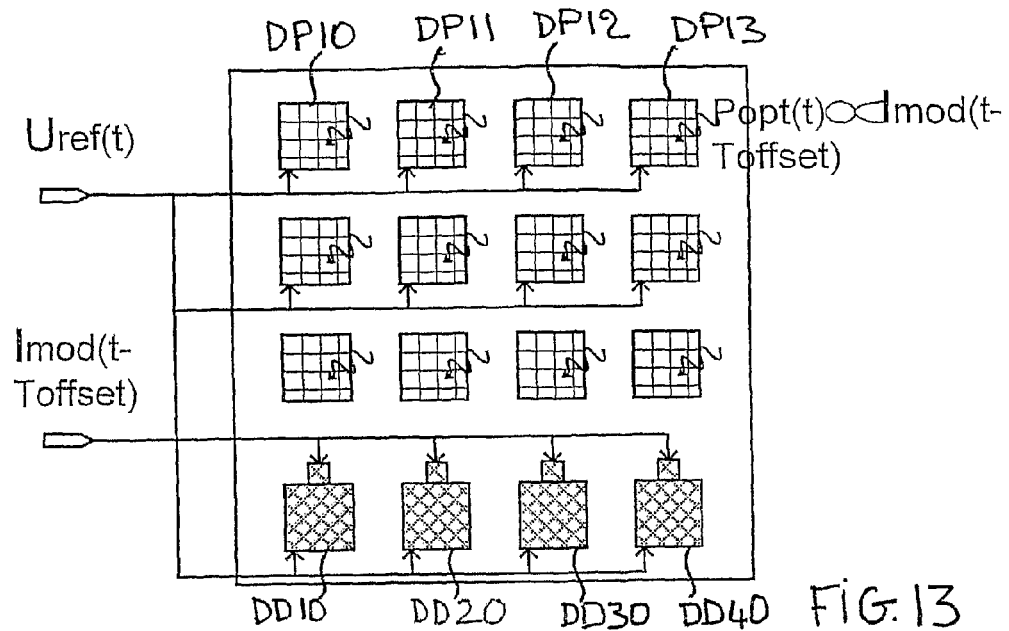
FIG. 13
FIG. 14
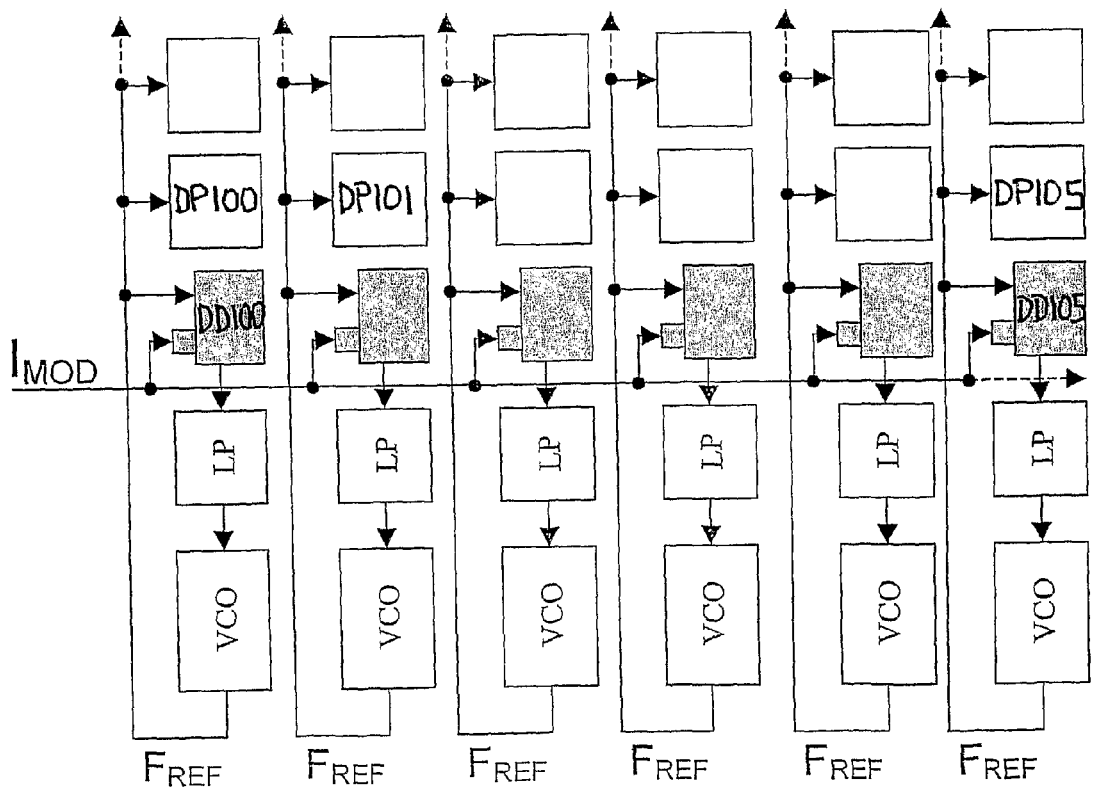

- high electric field
- low electric field
- → electric field: density and direction

- high-resistive material
- low-resistive material
- contact
- → electron current: density and direction

DEVICE AND METHOD FOR THE DEMODULATION OF MODULATED ELECTRIC SIGNALS

FIELD OF THE INVENTION

The present invention relates to a device and a method for the demodulation of all modulated electric signals, e.g., modulated currents or voltages, according to the preambles of the independent claims.

The demodulation method can be exploited in particular for phase-difference measurements of electronic signals and/or for the determination of amplitude and/or intensity. Depending on the particular design and application, the measurement data can be provided in a very short time frame of a few milliseconds or microseconds; even real-time measurements by an instantaneous adaptation of the output signal to the input signals are possible. If the demodulation measurement functions as a reference measurement, the invention allows the demodulation and the acquisition of the user data at the same time.

The device and method according to the invention may be used in many kinds of electronic circuits, mainly with the purpose of signal processing. In particular the device and method can be used for the measurements of temperature offsets in point, line or array image sensors with pixel structures capable of measuring the distance to an object.

Other applications of the invention relate to all measurement methods requiring the detection of the phase, amplitude or intensity information of an electronic current or voltage. More particularly, the invention relates to all measurement techniques that require the demodulation of several electrical signals in parallel. One possible application in the field of communication technology is the parallel demodulation of several data-transfer signals at the same time, such as found in modern multi-antenna or multi-channel systems. Another application is the optical distance measurement by the time-of-flight (TOF) principle, where the phase delay between a detected modulated photo-current and a reference signal is exploited for the extraction of the distance. A further application relates to the demodulation of electron currents in radio amplifier stages.

Furthermore the device according to the invention can be used in many kinds of signal processing hardware in any processing technology. In particular, standard processes such as a CMOS or a CCD process are possible.

The possibility of highly integrating the device in microelectronic circuits allows for the utilization of the device in signal processing circuits, either analog or digital, and imaging sensors.

BACKGROUND OF THE INVENTION

According to the theory of signal transmission, the demodulation of a signal corresponds to the mixing of the modulated signal with the sampling signal, and then the integration of the resulting product. The corresponding mixing step may be done using mixer circuits.

The basic element for many mixer circuits is a dual-gate transistor. An example of such a mixing circuit is presented by Sullivan et al. in "Doubly Balanced Dual(g)ate CMOS Mixer", IEEE Journ. Of Solid-State Circ., Vol. 34, No. 6, 1999. The combination of at least four dual-gate transistors leads to a double balanced mixer for very high frequencies in the GHz range. Another example of an electronic mixer circuit based on dual-gate transistors is presented in U.S. Pat. No. 4,603,436 A (Butler, "Microwave Double Balanced Mixer", 1986).

The above-mentioned mixer circuits have the disadvantage that several dual-gate transistors are required with additional load resistors, low-pass filters or differential amplifiers, which leads to a relatively complex circuit. Moreover, the size of the circuits does not allow the implementation as elements in a high-density array, such as, e.g., in the pixel structures of image sensors. Furthermore, for the intermediate frequency (IF) signal, an integration process of the IF signal would be required after the mixing process. As the number of phases would define the number of additional mixing elements, the required chip area increases. Furthermore, the mixing circuit is not useful for the mixing of very small modulated currents such as, e.g., photo-currents, because the mixing process is performed in the current domain instead of the less noisy charge domain.

In the publication EP-0'837'556 A1 (Wang, "Four terminal RF mixer device", 1997) a so-called four-terminal-radio frequency (RF) mixer is described based on a MOS transistor having drain, source, gate and back-gate contacts. The radiofrequency (RF) signal and the local-oscillator (LO) signal are applied to the gate and back-gate contacts, respectively. A current flowing from the source to the drain of the transistor corresponds to the mixing result delivering the intermediate frequency (IF) signal. The disclosed mixing process has been reduced to only one transistor element and an additional load circuit. Different embodiments allow for partial and double balanced/unbalanced mixing, respectively. Although the basic mixing element has already been reduced to very compact size, the double balanced mixing still needs at least four discrete transistors of which each requires a gate, a source diffusion, a drain diffusion and an additional well implant. An in-phase/quadrature (I/Q) mixing circuit would look similar with only the signals being slightly different. The complex circuit consisting of many mixing transistors implies relatively large chip sizes to be used. Additionally, the four transistors have to match with high accuracy for the demodulation of very small input signals. Hence, the requirements put on the fabrication process are demanding and may reduce the expected fabrication yield dramatically.

In the field of demodulation devices, photo-sensitive sensors are known which use a device enabling the demodulation of the light waves. Such devices are described in the publications DE-44'40'613 C1, GB-2'389'960 A (Seitz, "Four-tap demodulation pixel") and in the European patent application No. 04'405'489 (Büttgen et al., "Large-area pixel for use in an image sensor"). All these devices are directed to photo-currents with low intensities.

SUMMARY OF THE INVENTION

The object of the present invention is to provide a solid-state, non-photosensitive device and a method for the demodulation of electric signals whose origin may be arbitrary. The demodulation of the signal shall work at low and high modulation frequencies up to the GHZ frequency range. The device and method shall be able to process both a modulated voltage and a modulated current signal.

This object and other objects are solved by the device and the method as defined in the independent claims. Preferred, advantageous or alternative features of the invention are set out in dependent claims.

A demodulation device in semiconductor technology and a demodulation method are disclosed. The device is capable of demodulating an injected modulated current, wherein the current source can be of arbitrary origin, either electronic or optical. Modulated voltage signals can be processed by the addition of an appropriate voltage-to-current converter. The small size of the demodulation device allows high integration levels of the device in a point-type, line-type or array-type manner. The principle of demodulation exploits almost noise-free transport methods of electronic charge carriers enabling the demodulation of both high-current and very-low-current signals, e.g., photo currents. The small size and the ability to reproduce the device in standard semiconductor technologies such as complementary metal oxide semiconductor (CMOS) or charge-coupled device (CCD) processes make a very cost-efficient integration of the device possible. The fields of applications are wide-spread. Examples of applications can be found in electronic imaging, three-dimensional image capturing, calibration of electronic circuits, signal processing, data transmission or communications, phase-locked loop circuitry, delay-locked loop circuitry and radio-signal demodulation.

The inventive demodulation device in a semiconductor substrate is for the demodulation of a modulated electric signal. It comprises an input node for a modulated signal corresponding to the modulated electric signal, a sampling stage for sampling the modulated signal at least two different time intervals within a modulation period, and at least two output nodes for electric signals sampled in the sampling stage. The sampling stage comprises transfer means for transferring the modulated charge-current signal during each of the at least two time intervals from the input node to one of the at least two output nodes allocated to the respective time interval.

The modulated current signal is injected into a sampling stage where the demodulation is performed by a sampling process of the current signal. The sampling stage performs the demodulation process and delivers an arbitrary number of different samples of the modulated signal depending on the particular implementation. The sampling stage can be implemented using standard semiconductor processes such as CMOS and respective or CCD process. This allows a very cost-efficient fabrication of the device. The utilization of a CMOS process enables furthermore the instantaneous sampling of the modulated signal, wherein a raw CCD process only allows the integration by accumulation of charges over a certain period of time.

A light shield above the complete device ensures that it is not photo-sensitive, so that no photo-generated electrons or holes can disturb the functioning of the device. The light shielding should preferably be highly efficient in the visible and near-infrared range of the electromagnetic spectrum. Only in photo-sensing elements the light shield could be omitted so that the sampling region is also used for electron-hole-pair generation. However, also in the sense of imaging, the main part of modulated photo-current stems from the current-injection stage that could be a photo-diode or a photo-transparent, dendritic gate structure.

Due to its compact size the demodulation device subject to this invention can be arranged as a single device, but also in linear or two-dimensional manner realizing a complete matrix of parallel demodulating devices. Since the device can be fabricated with industry-standard semiconductor processing steps, it is compatible with commercially available CMOS and CCD processes, and it can be combined with any further electronic circuitry integrated on the same die.

The device according to the present invention overcomes the drawbacks of the prior art by providing a means with which small modulated current or voltage signals can be demodulated very rapidly and with high accuracy. Furthermore, the size of the complete demodulation device is much smaller than that of mixing or sampling circuits using discrete electronic components.

The inventive method for the demodulation of a modulated electric signal comprises the steps of:

sampling a modulated signal corresponding to the modulated electric signal at least two different time intervals within a modulation period, allocating one of at least two output nodes to each of the at least two time intervals, and transferring the modulated signal during each of the at least two time intervals to the output node allocated to the respective time interval.

A further subject of the invention is a method utilizing the above-mentioned device for the compensation of temperature-dependent artifacts in phase-measuring systems such as communications, signal-conditioning and distance measurements based on the time-of-flight principle.

One application of the method is the measurement of phase delays in range sensors, either 1D, 2D or 3D sensing systems. The method aims at compensating any temperature drifts causing additional phase delays between the signals used for the distance acquisition. By implementing a complete row of such demodulation devices, a calibration value for each column of the pixel matrix is acquired in parallel to the values delivered by the regular optically-sensitive pixels.

The present invention greatly relaxes the requirements to the semiconductor process technology compared to prior-art mixing devices. Only one single demodulation device is required for the demodulation of the current signal. The device works completely in the charge domain, so that no device-matching problems arise during the demodulation process. The operation in the charge domain also allows very simple and efficient demodulation of modulated currents down to a few picoamperes, such as, e.g., modulated photo-currents, without additional noise contributions from the demodulation stage. The size of the new device is even more reduced as only one gate structure and a number of diffusions corresponding to the number of samples are required. In particular, the number of samples can be chosen almost arbitrarily, whereby the demodulation area does not increase significantly, so that the device remains very compact and is well suited for very-large-scale-integration (VLSI) circuits.

The device according to the present invention enables the sampling of modulated current or voltage signals. It has a compact size and hence can be well integrated with additional electronic circuits on one single chip. Standard semiconductor processes such as CMOS or CCD processes are supported, which makes the production of the device extremely cost-efficient.

BRIEF DESCRIPTION OF THE DRAWINGS

Embodiments of the invention and, for comparison, a prior-art device are described in greater detail hereinafter relative to the attached schematic drawings.

FIG. 13 shows a schema of a distance measurement sensor with a matrix of photo-sensitive demodulation pixels and an additional row of non-photo-sensitive demodulation devices according to the invention used for a column-wise calibration measurement.

FIG. 14 shows a schema of a distance measurement sensor with a matrix of photo-sensitive demodulation pixels and a row of phase-locked-loop circuits of FIG. 11 for a temperature-offset compensation.

DESCRIPTION OF PREFERRED EMBODIMENTS

Figure 1A:
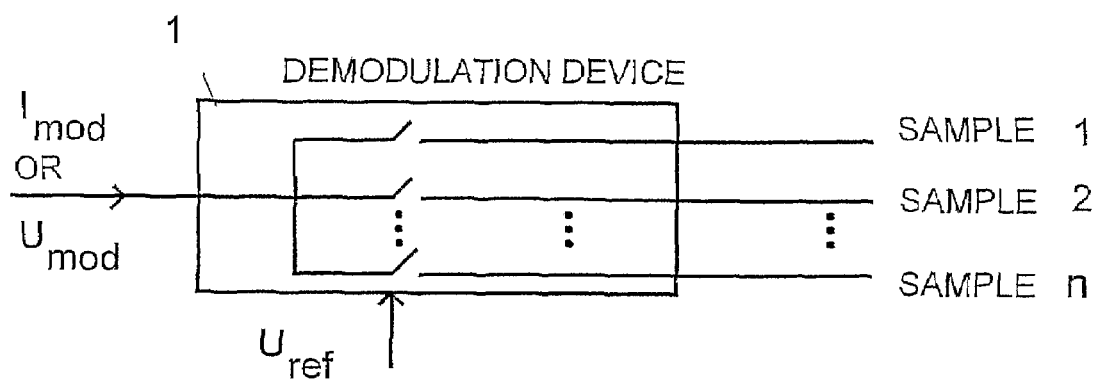
FIG. 1(a) shows a general block diagram of the demodulation device according to the invention.

FIG. 1(*a*) shows a demodulation device 1 according to the invention. A modulated electric signal, e.g., a modulated voltage signal Umod or a modulated current signal Imod, is an input of the demodulation device 1. This demodulation device 1 processes the modulated electric signal, which results in a certain number of samples sample_1, . . . , sample_n. A reference voltage Uref applies the sampling frequency for the sampling to the demodulation device 1.

As shown in FIG. 1(*b*), the demodulation device 1 comprises a current-injection stage 1.1 and a sampling stage 1.2. The current-injection stage 1.1 receives the modulated electric signal as input and injects the charge carriers of the modulated current signal in the sampling stage 1.2. Then, the sampling stage 1.2, using the reference voltage Uref for the sampling frequency, samples the modulated current signal, which results in the demodulation of the signal.

Figure 1B:
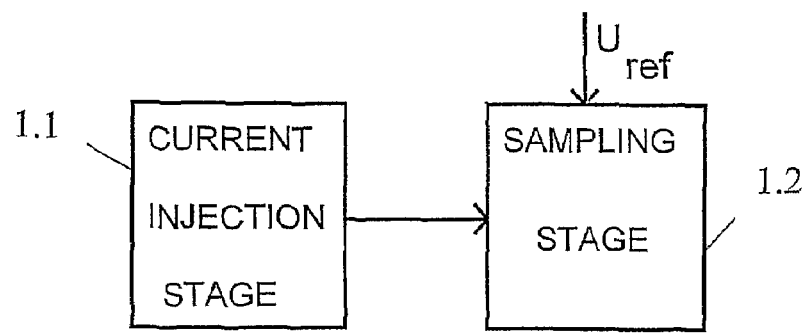
FIG. 1(b) shows a more detailed block diagram of the demodulation device of FIG. 1(a)
Figure 2:
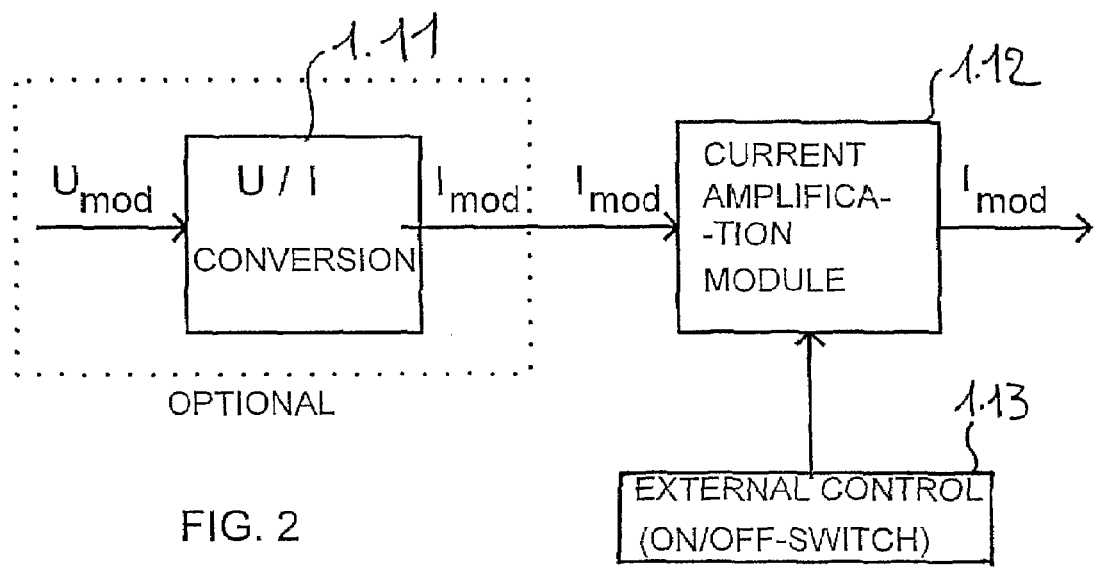
FIG. 2 shows a block diagram of the current-injection stage according to the invention.

FIG. 2 illustrates the current-injection stage 1.1 of FIG. 1(*b*). The current-injection stage 1.1 comprises a current-amplification module 1.12. The current-amplification module 1.12 is used to accomplish the current injection without influencing the original modulated signal. If a modulated voltage signal has to be demodulated, the current-injection stage 1.1 includes an additional voltage-current conversion stage 1.11 just before the amplification module 1.12. To those skilled in the art, it is obviously simple to enhance the current-injection stage 1.1 in such a way that the duration of injecting charges into the sampling stage can be externally controlled. This can be done for example by at least one additional switch 1.13.

Thus, the voltage-current conversion stage 1.11 delivers as output signal a modulated current signal Imod that is decoupled from the input modulation signal Umod. The output signal Imod is used for the injection of charges into the demodulation stage. The type of charge carriers injected into the sampling stage can be electrons or holes. The set-up of the sampling stage 1.2 of FIG. 1(*b*) has to be adapted accordingly. The electron injection may be preferred because of the higher mobility of electrons in traditional semiconductor materials such as silicon, gallium-arsenide, etc. This in turn allows the demodulation of high-frequency signals.

Figure 3:
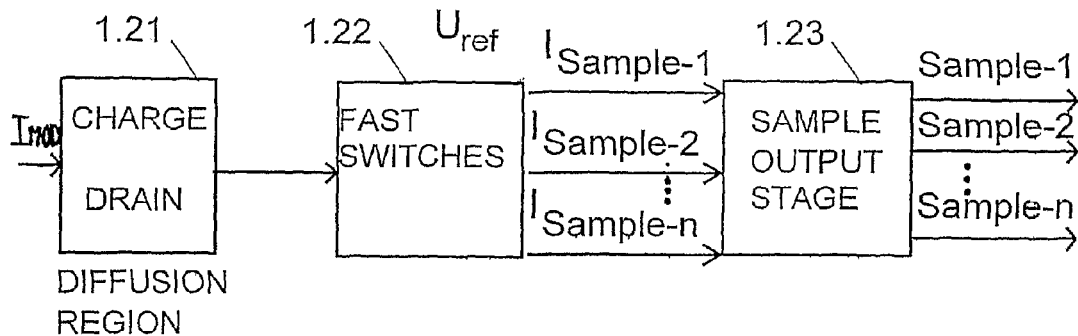
FIG. 3 shows a block diagram of the sampling stage according to the invention.

FIG. 3 illustrates the sampling stage 1.2 of FIG. 1(*b*) in more detail. The sampling stage comprises a charge drain 1.21 which represents a diffusion region. This diffusion region 1.21 drains the injected charges to a demodulating region. The demodulating region comprises a fast-switch module 1.22 with at least two switches conducting the modulated current at any time to exactly one output. In the example of FIG. 3, the fast-switch module 1.22 has n outputs of currents, each corresponding to one sample current Isample_1, . . . , Isample_n. The fast-switch module is advantageously implemented in a CCD structure with drift fields enabling high frequencies. The sample currents are the inputs of a sample output stage 1.23. Two different embodiments of the output stage 1.23 are discussed in the following.

The first embodiment of the sample output stage 1.23 is shown in FIG. 4(*a*). The sample output stage comprises an accumulation module 1.230 and a charge-voltage converter 1.231. The accumulation module 1.230 is for example a capacitor which integrates the sample current. The integrated charge carriers induce a potential drop over the capacitor that can be read out by a further electronic circuit 1.231. Generally, additional amplification circuits such as e.g. a source follower are foreseen in order to drive the following analogue-to-digital converter circuit or any other electronics not shown in FIG. 4(*a*).

The second embodiment of the sample output stage 1.23 is detailed in FIG. 4(*b*). The sample output stage 1.23 comprises a direct current-voltage converter 1.235 aims at a direct conversion of the sample currents Isample_1, . . . Isample_n into corresponding sample voltages Usample_1, . . . Usample_n. As the accumulation module 1.230 of FIG. 4(*a*) is not provided in this embodiment, the sample output provides an instantaneous change of the final sample voltage which is necessary for example in receiver systems. However, if the sample currents are very small, the first embodiment of FIG. 4(*a*) enabling the accumulation of the charge carriers has the advantage of increasing the signal-to-noise ratio by integrating the sample currents over many modulation periods, e.g., hundreds or thousands.

Figure 5:
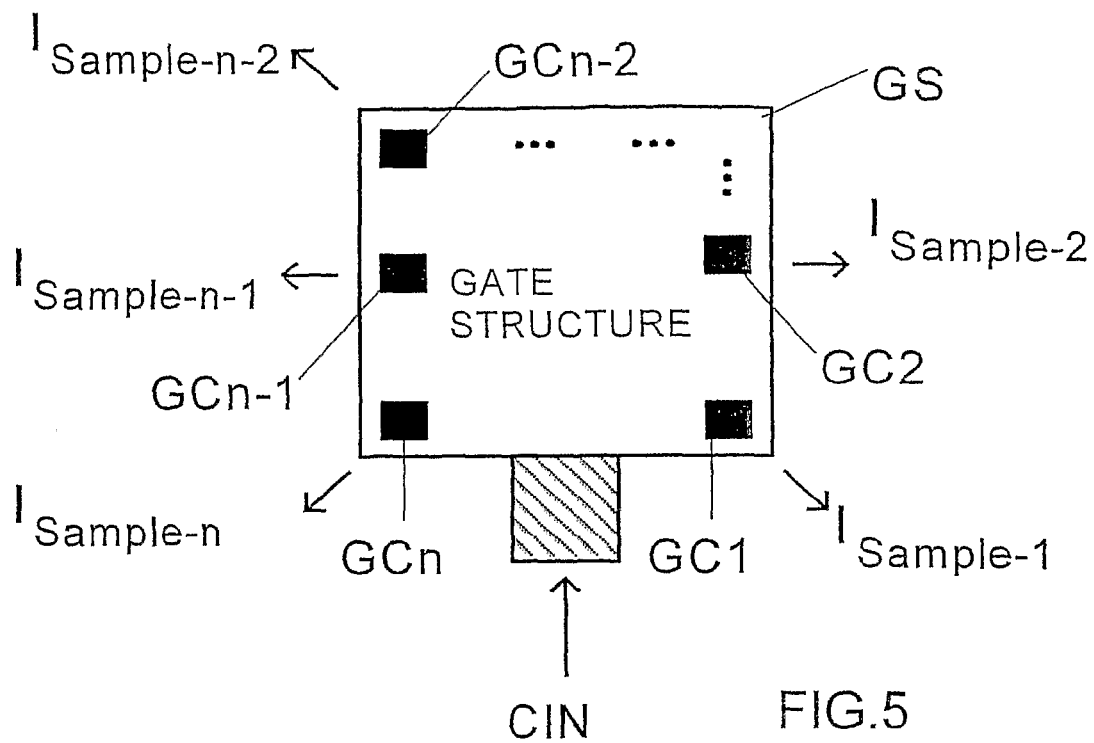
FIG. 5 shows a general implementation of the sampling stage according to the invention.

The implementation of the sampling stage 1.2, also designated as sampling unit, is made of a compact gate structure GS with, e.g., n gate contacts GC1, . . . , GCn as shown in FIG. 5. The gate structure GS can be internally built by several adjacent gates whose margins possibly overlap as it is provided by CCD processes. The widths of the gates may not exceed the minimal feature sizes as prescribed by the specific processing technology, so that smallest sampling units can be realized. The sampling unit 1.2 could be compared to a photosensitive demodulation pixel as described in the publication DE-44'40'613 C1 (Spirig et al.) that is used for the demodulation of modulated light waves. Another possibility for the realization of the gate structure GS is a high-resistive gate similar to the one used for photo-sensing devices described in the publication GB-2'389'960 A (Seitz, "Four-tap demodulation pixel") and in European patent application No. 04'405'489 (Büttgen et al., "Large-area pixel for use in an image sensor"). The present invention includes the geometrical structures introduced in said publications as well. However, the demodulation device 1 according to the present invention allows the demodulation of modulated currents by having an injection region defined as the current injection node CIN in FIG. 5.

By setting the gate contact potentials alternately to high potential levels, the charge carriers injected into the diffusion region CIN and spread out below the complete gate structure GS are forced to drift or diffuse to the specific corner of the gate contact, respectively. The alternation of the gate contact potentials is done synchronously with the sampling frequency. The charge flow into the direction of the gate contacts is either integrated on a capacitance or it generates a voltage drop over a subsequent low-pass filter. The voltage drop or the number of charge carriers on the capacitor correspond to the sample value.

Without further considering the implementation of the gate structure GS, the sampling unit makes use of a semiconductor material such as silicon for the transport of injected charge carriers. As an example only, in the preceding description the material was assumed to be p-doped and thus one wants to demodulate a current of electrons. The invention covers also the demodulation of hole-currents as minority carriers in an n-doped semiconductor material wherein the gate voltages need to be of negative instead of positive nature. The semiconductor is covered with a transparent insulating layer, preferably an oxide, as available in industry standard CMOS processes. The oxide-layer thickness is chosen in the range of 1 nm to 500 nm, according to the specifications of the selected semiconductor process, in order to transfer a large part of the electric surface fields into the semiconductor material, while maintaining robust processing and high fabrication yields without short-circuits in the gate. On top of that oxide layer, the gate structure with n contacts is located.

It is to be understood throughout the description that the integer n is equal to or greater than two.

The preferred realization of the gate structure with its gate contacts and its adjacent injection region will be described hereinafter with reference to the preferred embodiments and the preferred implementation of the injection stage. All transportation processes of charge carriers below any gate structure GS can be realized in buried channels in order to increase the efficiency of the charge transport. Also special implementations of the buried channel, e.g. a channel with built-in drift-fields for an even faster charge-transport as described by A. L. Lattes et al. in the publication "Ultrafast Shallow-buried-channel CCD's with Built-in Drift Fields", IEEE Electron Device Letters, Vol. 12 N° 3, March 1991, are possible.

Figure 6A:
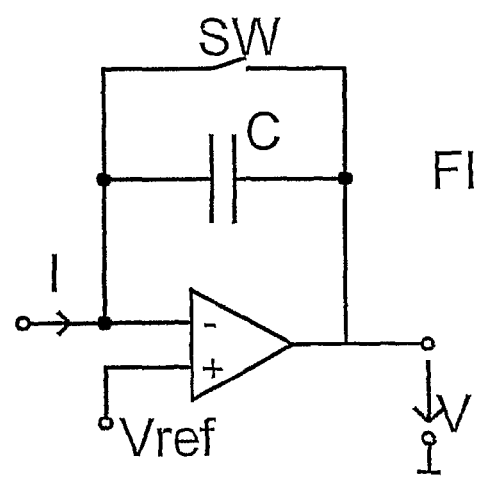
FIG. 6 shows two examples of output amplifiers for use in the invention.
Figure 6B:
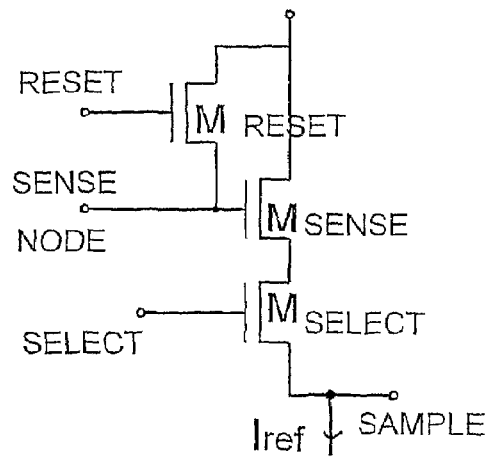

The very small size of the demodulation device of this present invention allows the integration of potentially a few hundreds or even several thousands of such devices on a single chip together with further electronic circuitry. Each demodulation device is equipped with reset lines for the reset of the sample nodes and select lines for readout purposes. In many cases, the readout of each sample needs additional amplification stages in order to be able to drive fast enough the parasitic capacities of the subsequent electronic. Two examples of known amplification stages are shown in FIG. 6. FIG. 6(a) shows a Miller integrator and FIG. 6(b) shows a source-follower circuit, also often used in imaging sensors for the readout of the pixels. These examples of amplification stages are not further detailed, as they are known in the art.

Figure 4A:
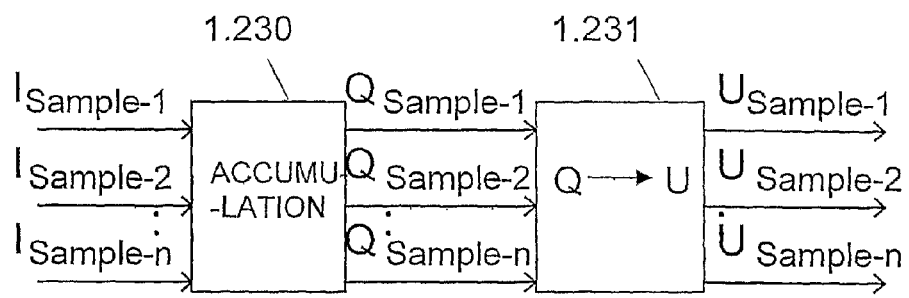
FIG. 4 shows block diagrams of two embodiments of the sample output stage according to the invention.
Figure 4B:
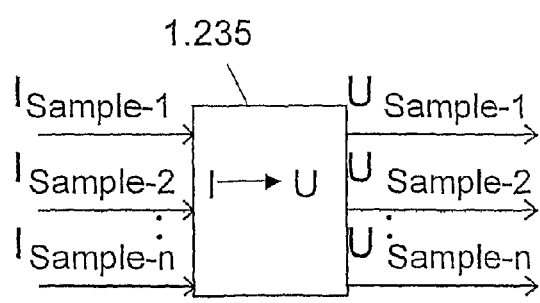

The electronic timing circuit, employing for example a field-programmable gate-array (FPGA) or an application-specific integrated circuit (ASIC) implementation, generates the gate signals for the sampling stage 1.2. Each voltage configuration on the gate structure has the property that a different gate contact, also called electrode contact, receives the highest potential. During this time interval, injected charge carriers flow to the corresponding storage diffusion for accumulation as indicated in FIG. 4(a), or the charge carriers are fed into a current-to-voltage converter for instantaneous sampling as indicated in FIG. 4(b). As example, only two signal values A0 and A1 of a modulation signal sampled at times that differ by half of the modulation period, allow the calculation of the phase P and the amplitude A of a sinusoidal intensity modulated and offset-free current injected into the sampling stage 1.2. The equations look as follows:

$$A=(A0+A1)/2$$

$$P=\arcsin[(A0-A1)/(A0+A1)].$$

Extending the example to four signal values requires in practice a different gate structure with four gate contacts and four storage nodes and an appropriate clocking scheme for the electrode voltages in order to obtain four sample values A0, A1, A2 and A3 of the injected current. Generally the samples are the result of the integration of injected charge carriers over many quarters of the modulation period, whereby finally each sample corresponds to a multiple of one quarter of the modulation period. The phase shift between two subsequent samples is 90°. Using these four samples, the three decisive modulation parameters amplitude A, offset B and phase shift P of the modulation signal can be extracted by the equations $$A=\mathrm{sqrt}[(A3-A1)^2+(A2-A1)^2]/2$$

$$B=[A0+A1+A2+A3]/4$$

$$P=\arctan[(A3-A1)/(A0-A2)]$$

A first method which profits from the above-mentioned device according to the invention is the phase measurement between two signals. Furthermore, also the offset and amplitude measurement can be of interest. As an example, the demodulation of emitted and electronically detected radio waves requires a demodulation in order to get the phase information. As radio-transmitted data is generally phase- or frequency-modulated or both, the phase between the detected signal and a reference signal has to be measured for demodulation. Another example of application is the measurement of a phase delay between an electronic reference signal and a photo-detected signal, wherein the photo-detected signal shows a phase delay due to the travel time to an object and back to the sensor. In that application the phase detection is used for distance measurement to an object.

Figure 7:
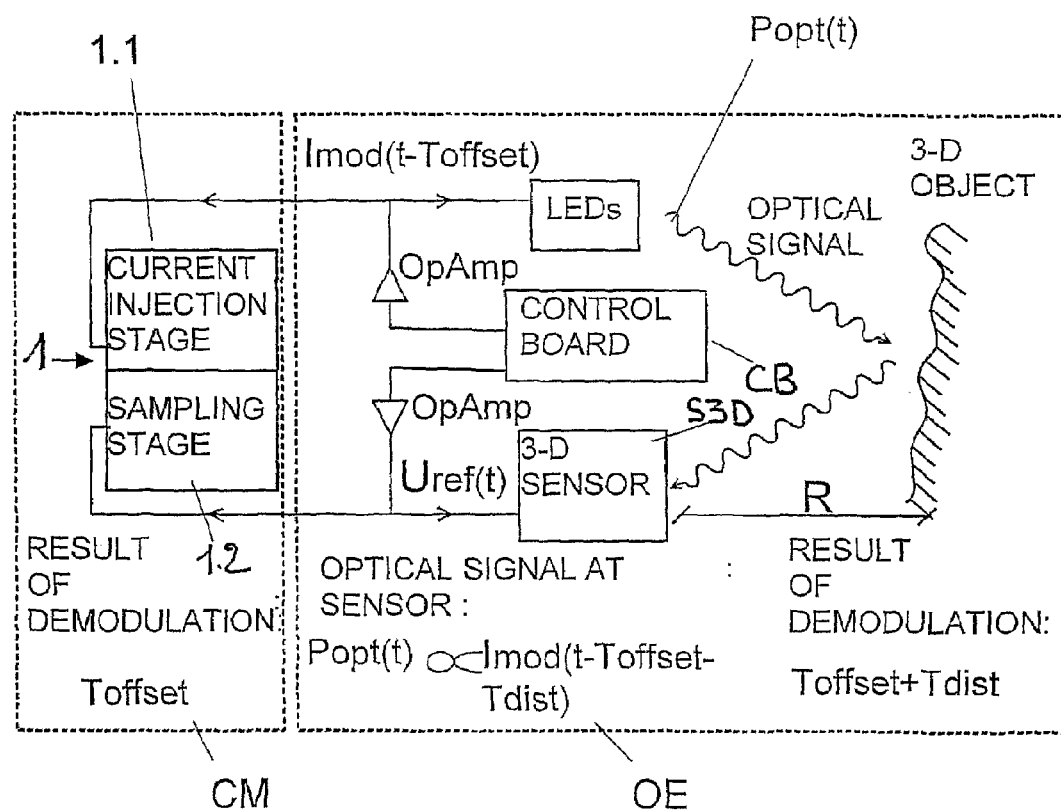
FIG. 7 shows a distance measurement system based on time-of-flight distance sensors and a calibration measurement system based on the demodulation device according to the invention.
Figure 8A:
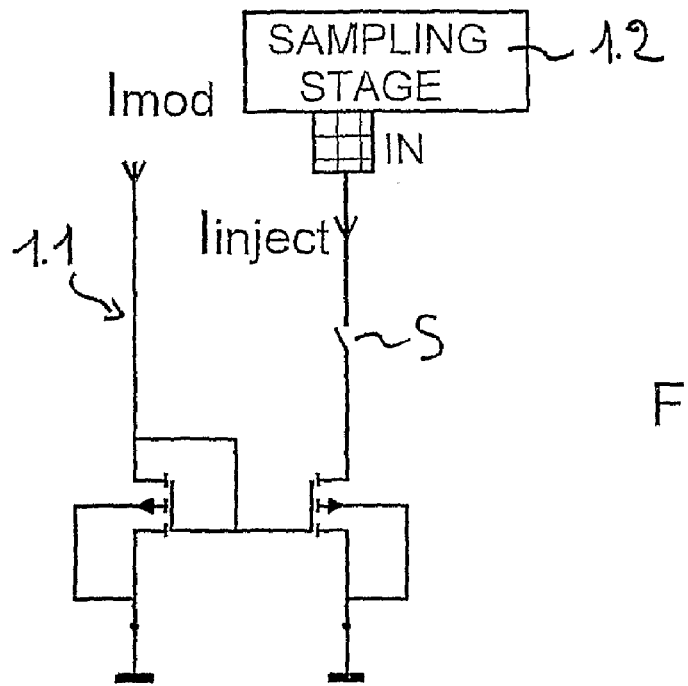
FIG. 8 shows four implementations of the current-injection stage.
Figure 8B:
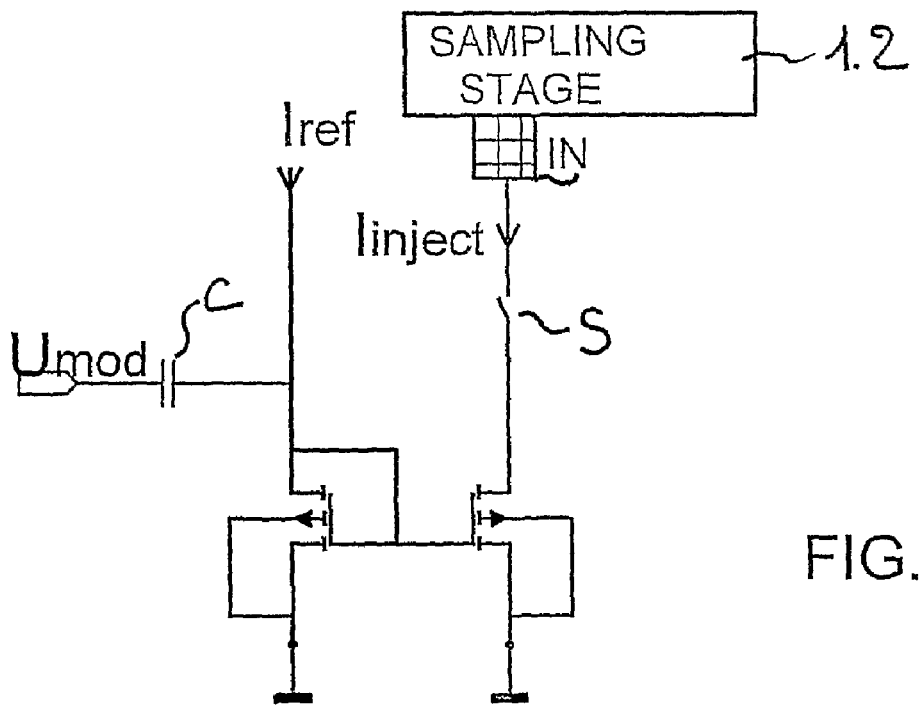
Figure 8C:
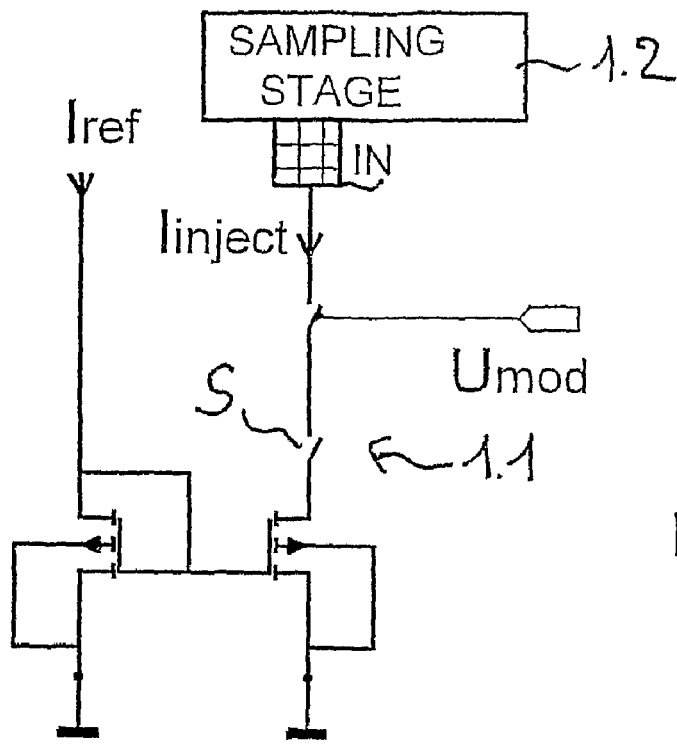
Figure 8D:
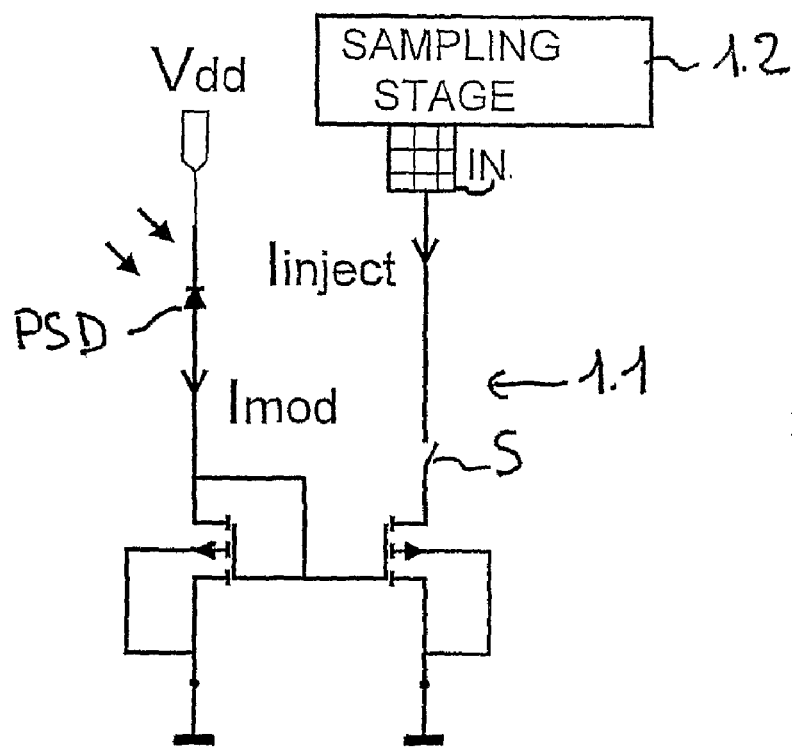

A further application example of the phase measurement method is the calibration measurement in a time-of-flight (TOF) distance measurement system ensuring the independence of the distance measurement from measurement errors, e.g., due to temperature drift or system-inherent phase delays in the electronics. A possible set-up of such a TOF distance measurement system is depicted in FIG. 7. A right-hand part OE in dashed line of FIG. 7 is described first. Light-emitting diodes LEDs send out a modulated optical signal Popt(t), wherein the driving current signal Imod(t) is provided by a separate control board CB. The optical signal reflected and/or scattered by the object is detected and demodulated by demodulation pixels S3D; this could be, e.g., a pixel structure as disclosed in GB-2'389'960 A. The extraction of the phase delay between the reference-voltage signal Uref(t) and the optical signal Popt(t−Tdist) delivers a value for the distance R between the sensor and the object. Tdist describes the travel time of the optical signal to the object and back to the sensor.

Under the impact of temperature change, an additional phase delay Toffset causes measurement errors. With regard to additional delay components the driving current signal can be rewritten as Imod(t−Toffset) and the detected optical signal is Popt(t−Tdist−Toffset). Therefore the measured distance Dpix directly corresponds to Tdist+Toffset with an error of Toffset. However, the measurement of the phase error Toffset caused by temperature drifts of the electronic components can be performed by the not-photo-sensitive demodulation device 1 according to the invention. The right-hand part OE of FIG. 7 is linked to a left-hand part CM in dashed line of this figure. By injecting a fraction of the LED current signal Imod(t−Toffset) into the demodulation device 1 and taking the same voltage reference signal Uref(t) as for the in-pixel demodulation, the phase offset is measured and exploited for the calibration of the distance measurement.

The utilization of the new demodulation device 1 instead of prior-art mixer elements, e.g., the four-terminal RF mixer device, is particularly adapted within the application of compensating phase offsets in 3D-imaging systems. Indeed the architecture of the demodulation device according to the invention can be similar to the demodulation architecture of the photo-sensitive pixels, so that no additional phase errors occur due to different demodulation stages in the pixels and the reference mixing element.

FIG. 8 shows preferred embodiments of the current-injection stage 1.1 of FIG. 1(b) linked to the sampling stage 1.2 through its injection node IN. In all four FIGS. 8(a)-(d), the modulated current Imod is mirrored using, e.g., the known electronic circuit consisting of two transistors called current mirror. The current Imod is thus amplified using this current-mirror circuit. The mirrored current is used as injection current to the sampling stage 1.2. A switch S controls the duration of current injection into the sampling stage. This switch corresponds to the external control 1.13 of FIG. 2. The switch S can be formed by one single transistor or a transmission gate. FIG. 8(b) illustrates particularly the conversion of the modulated voltage signal Umod into a modulated reference current Iref that is injected into the sampling stage 1.2. The voltage-to-current conversion is done using e.g. a condensator C. FIG. 8(c) illustrates a second embodiment of the voltage-to-current conversion Umod into Iref. FIG. 8(d) illustrates more particularly the current-injection stage 1.1 using a photosensitive diode PSD as a current source for the modulated current Imod.

Figure 9A:
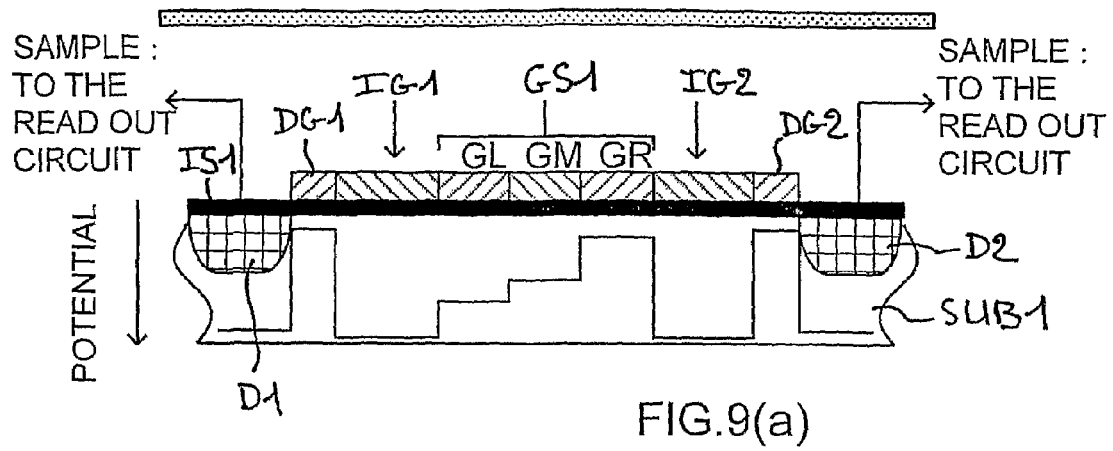
FIG. 9 shows a first implementation of a gate structure according to the invention with three gates and two gate contacts for the delivering of two samples of the injected modulated current (a) in a cross section and (b) in a top view.
Figure 9B:
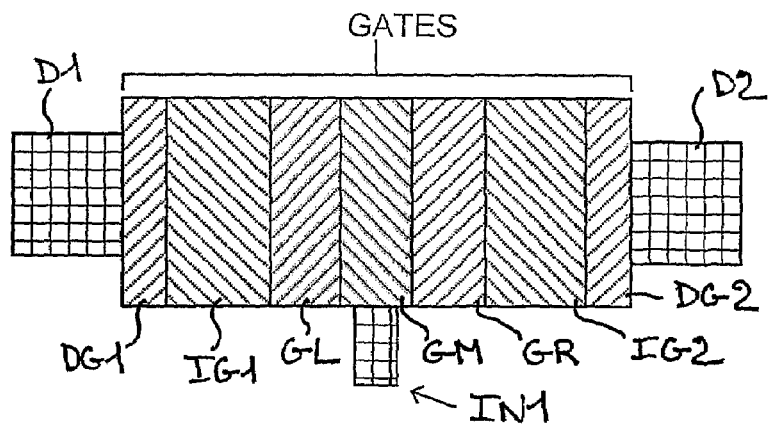

FIG. 9 illustrates an example of a sampling stage 1.2 providing two samples at the same time. FIG. 9(a) shows a cross section of the sampling stage 1.2 and FIG. 9(b) shows the corresponding top view. In the embodiment of FIG. 9, the sampling stage 1.2 comprises an injection node IN1 being a diffusion region, a gate structure GS1, two integration gates IG1 and IG2, two corresponding decoupling gates DG1 and IG2 and two corresponding diffusion regions D1 and D2. As known, the diffusion region IN1, D1 and D2 are in the semiconductor substrate SUB1, the gates are separated from the substrate by an insulator IS1 and are protected by a light shield LS1. The gate structure GS1 comprises three adjacent gates: a left gate GL, a middle gate GM and a right gate GR. The integration gate IG1 and IG2 are each adjacent to one of the left gate GL and right gate GR. As an example only, the potentials applied at a given time to the different gates are shown in FIG. 9(a). By setting one gate, e.g., GL, to a high potential and the other gate, e.g., GR, to a low potential, the potential gradient enforces the injected charges to drift to the specific integration gate IG1 or IG2.

Figure 10A:
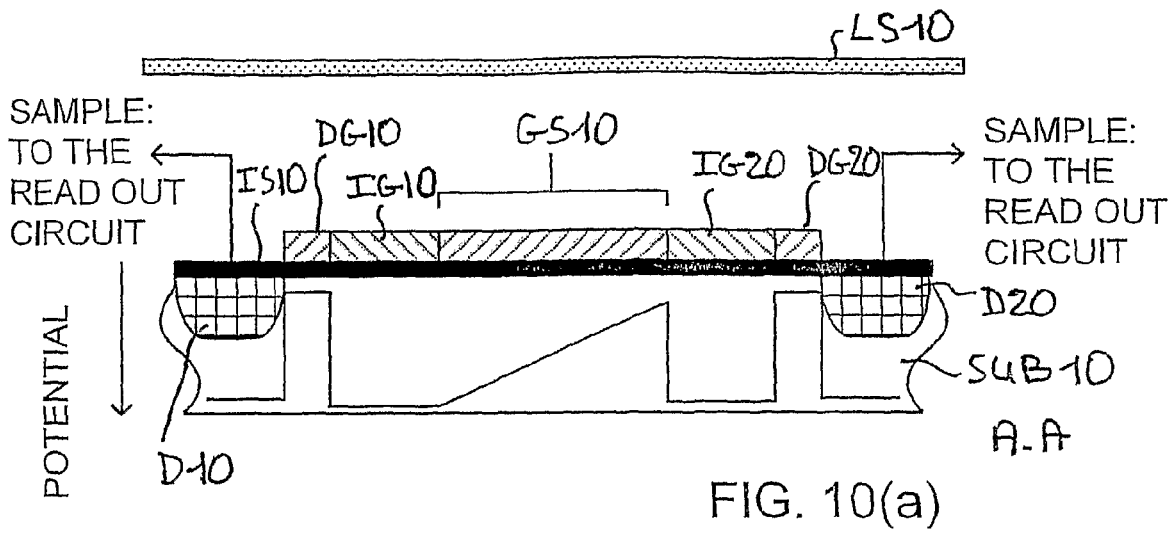
FIG. 10 shows a second implementation of a gate structure according to the invention with one high-resistive gate and four gate contacts for the delivering of four samples of the injected modulated current (a) in a cross section and (b) in a top view.
Figure 10B:
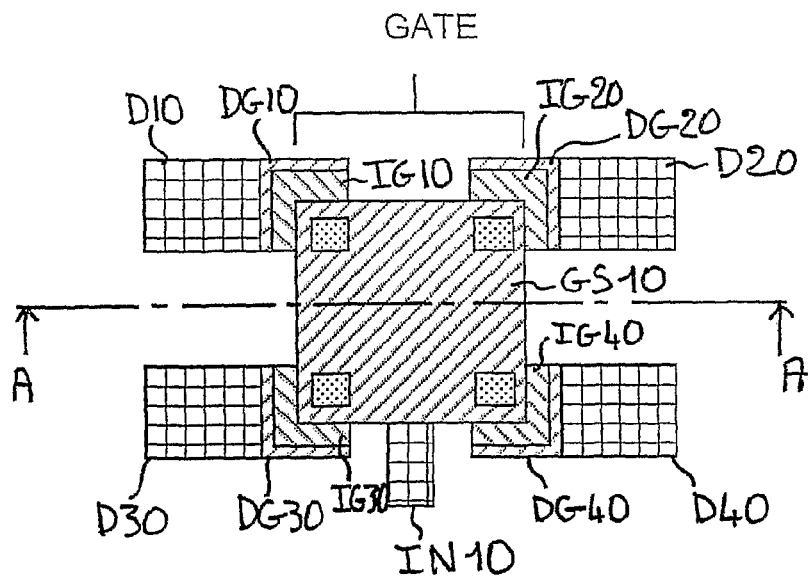

FIG. 10 gives another example of the sampling stage 1.2 providing four samples at the same time. FIG. 10(a) shows a cross section of the sampling stage 1.2 and FIG. 10(b) shows a corresponding top view. The gate structure is different from that of FIG. 9. In the embodiment of FIG. 10, the gate structure GS10 is a high-resistive gate having the form of a square. At each corner of the square gate structure GS10, an integration gate IG10, IG20, IG30, IG40, its corresponding decoupling gate DG10, DG20, DG30, DG40 which are high-resistive, and its corresponding diffusion region D10, D20, D30, D40 is arranged. The sampling stage 1.2 further comprises an injection node IN10 being a diffusion region. As known, the injection node IN10 and the diffusion regions D10-D40 are in the semiconductor substrate SUB10. The gates are separated from the substrate by an insulator layer IS10 and are protected from incident light by a light shield LS10.

As an example only, the potentials applied at a given time to the different gates are shown in FIG. 10(a). The potential gradient below the closed high-resistive gate GS10 due to a current flow through the gate itself enables the fast separation of the injected charges to just one storage node comprising an integration gate, its decoupling gate and its diffusion region.

Figure 15:
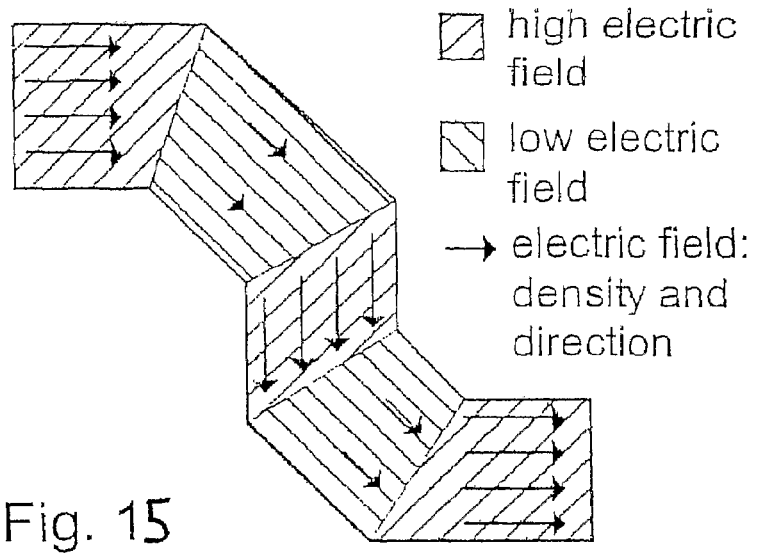
FIG. 15 shows a desired two-dimensional electric field distribution for a dendritic gate structure.
Figure 16:
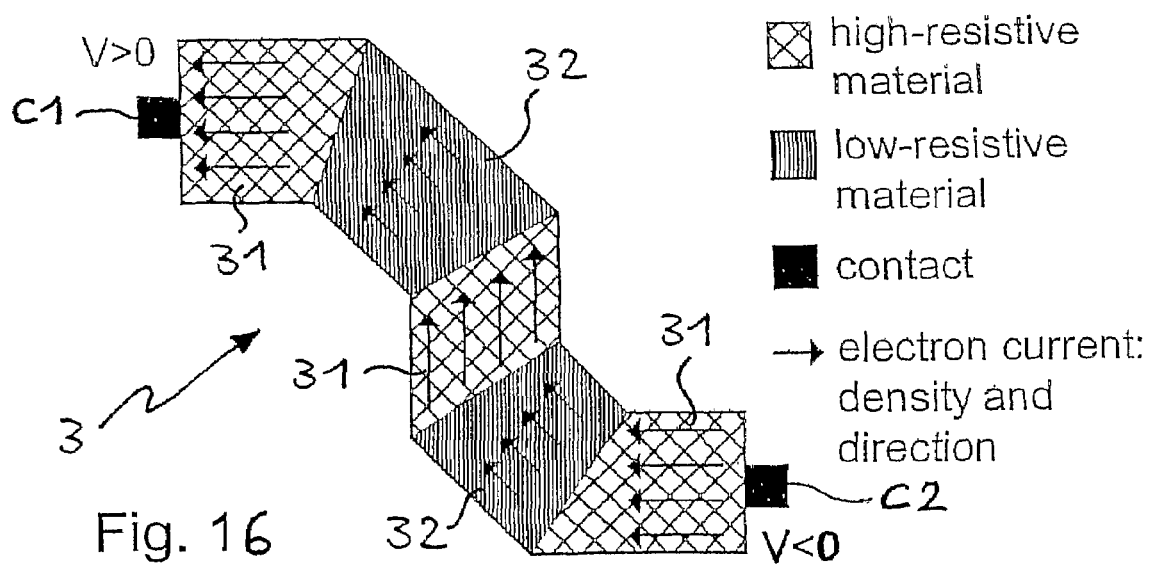
FIG. 16 shows a top view of combined low- and high-resistive gate structures realizing the electric field distributions.

The gate structure GS10 could also be fragmented, dendritic or arborescent, in order to reduce even more the power consumption of the sampling stage 1.2. Such a gate structure having its electrode layer in an arborescent shape is described in European patent application No. 04'405'489. A very simple example of the realization of a particular electric field distribution is depicted in FIGS. 15 and 16. FIG. 15 shows a desired two-dimensional electric field distribution, and FIG. 16 shows a combined low- and high-resistive gate structure 3 realizing the electric field distribution of FIG. 15. The architecture of the dendritic gate 3 allows the creation of any arbitrarily chosen two-dimensional distribution of the electric field in the gate 3 and in the semiconductor material. A two-dimensional arrangement of high- and low-resistive gate materials 31, 32 generates a two-dimensional electric field distribution varying in magnitude and direction. Throughout this document, the borderline between a "low-resistive material" 32 and a "high-resistive material" 31 is understood to lie at a sheet resistance of approximately 10 Ohms per square. Thus, high-resistive materials 31 are such with a sheet resistance higher than 10Ω/□, and preferably more than 10 kΩ/□, e.g., many tens of kΩ/□, and up to about 1 MΩ/□.

In this case, the combination of high- and low-resistive materials 31, 32 in the gate 3 is the fundamental tool for the generation of a desired electric field distribution due to a current flow through the gate 3 itself. Typically, whenever a specific two-dimensional electric field distribution is required, the topology of the corresponding gate structure 3 is of two-dimensional nature, too.

The dendritic gate 3 itself is contacted at its periphery with at least two (or more) contacts GC1, GC2 that are connected to static or switchable voltage sources, depending on the operation mode. Between the contacts GC1, GC2 there is at least one connection of high-resistive gate material 31. The current flowing through the dendritic gate structure 3 produces the two-dimensional potential distribution shown in FIG. 15, which is essentially reproduced at the surface of the semiconductor material at the same time.

The shape of the electrode layer 3 or its complementary shape may be harp-like, comb-like, tree-like, snake-like, ice-crystal-like, or is a perforated plane. This dendritic shape has the advantage to realize the optimum compromise between demodulation frequency, response speed due to the RC time constant of the dendritic gate, and the total power consumption of the gate and its associated electronic driving circuit.

Another implementation of the gate structure may be with floating gates or floating diffusion as described in European patent application No. 04'007'760. Examples of this implementation are shown in FIGS. 17 and 18.

Figure 17:
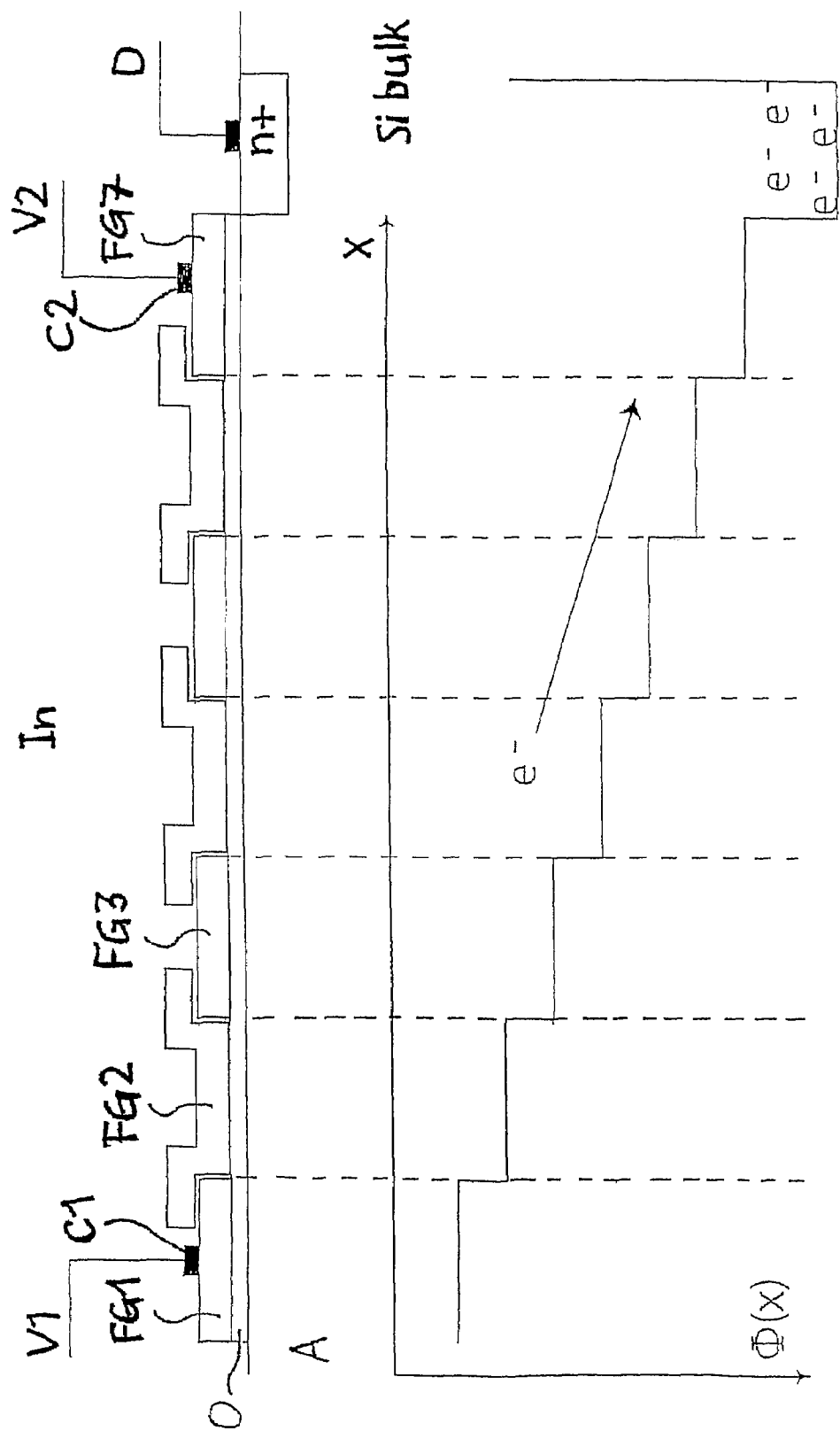
FIG. 17 shows a cross section of an embodiment of a gate structure having floating gates.
Figure 18:
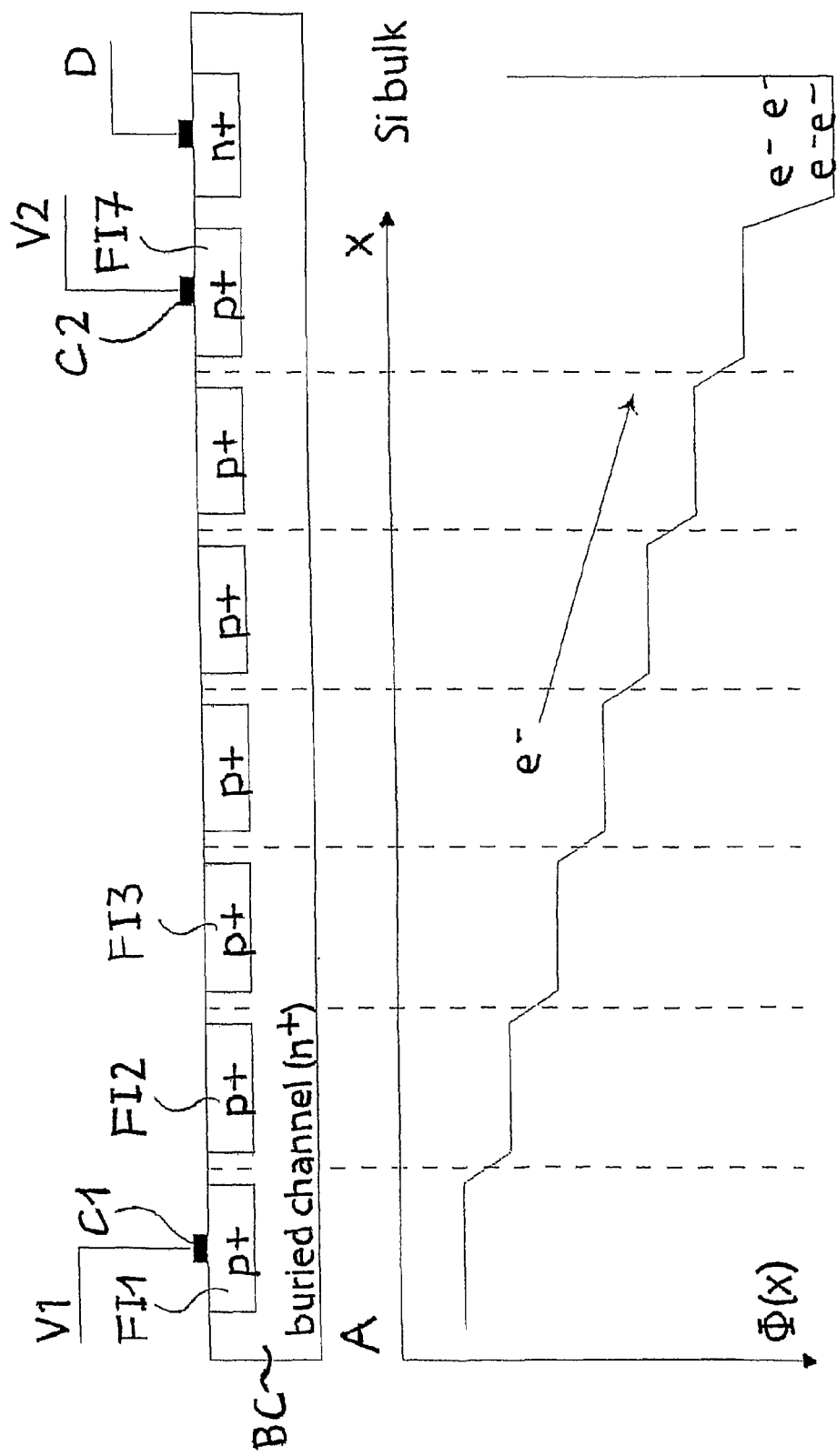
FIG. 18 shows a cross section of an embodiment of the sampling stage having floating diffusions instead of a gate structure.

FIG. 17 shows a cross section through a first embodiment of a sampling stage according to the invention, offering a high response speed. On a semiconductor substrate A, a plurality of floating gates FG1-FG7 are arranged. The substrate A may be, e.g., made of bulk silicon of the p doping type. However, other materials such as Germanium and/or other doping types such as the n doping type can be used for the substrate; for such alternatives, the person skilled in the art will be able to make the necessary adaptations to the embodiments described here. The gates FG1-FG7 are typically made of undoped or doped polysilicon. They are electrically isolated from each other, e.g., by an oxide layer (not shown) in which they are preferably embedded. A thin (preferably 1-500 nm thick) insulator layer O, e.g., a silica layer, separates the substrate A from the gates FG1-FG7.

The two furthest gates FG1, FG7 are each contacted by an electric contact C1, C2. When two different voltages V1 and V2 are applied to the contacts C1 and C2, respectively, the intermediate floating gates FG2(f)G6 take on an intermediate potential due to capacitive coupling. As a consequence, a discrete, steplike potential distribution $\Phi(x)$ is generated which depends on the horizontal coordinate x. The potential distribution $\Phi(x)$ acts across the insulator O at the interface between semiconductor substrate A and insulator O. Charge carriers, e.g., electrons e–, injected in the substrate A by the charge injection node are in move along the lateral electric field lines to the point of highest potential energy, e.g., C2 in case that V2 is larger than V1. Thus, according to the invention, the charge-separation and -transport task is taken over by a lateral electric field at the surface of the substrate A.

The charge-accumulation and -detection task is realized close to the contact C2 providing maximum potential. For this purpose, an n+ doped floating diffusion volume D is provided on the surface of substrate A in which the injected charge carriers are accumulated. The diffusion volume D is contacted by an electric contact for applying a voltage and reading out the charges. The potential of the accumulation diffusion D must be higher than the electrode-contact voltage V2, so that the minority carrier electrons are stored in the diffusion D. Alternatively, the charges can first be integrated below an integration gate and subsequently be read out through the diffusion volume D.

FIG. 18 shows a cross section through a second embodiment of a sampling stage according to the invention. In this embodiment, an array of floating implants FI1-FI7 is arranged on the surface of a semiconductor substrate A. The substrate A may be, e.g., made of bulk silicon of the p doping type. The floating implants FI1-FI7 may be p+ implants in an n+buried channel BC.

The function of the second embodiment (FIG. 18) is analogous to that of the first embodiment (FIG. 17). The two furthest floating implants FI1, FI7 are each contacted by an electric contact C1, C2, and two different voltages V1 and V2 are applied to the contacts C1 and C2, respectively. The intermediate floating implants FI2-FI6 take on an intermediate potential due to the punch-through mechanism. Thus an approximately discrete, step-shaped potential distribution $\Phi(x)$ is generated. The injected charge carriers, e.g., electrons e–, are detected in an n+ doped floating diffusion volume D in which they are accumulated.

If electrons are to be collected, the substrate A should be p doped. The accumulation diffusion D is of n+ type, and the voltages V1, V2 at the electrode contacts C1, C2 are such that the most positive voltage is applied to the contact C2 that is closest to the accumulation diffusion D. The voltages must be high enough so that a depletion zone extends from the semiconductor-oxide interface into the semiconductor substrate A. The potential of the accumulation diffusion D must be higher than the electrode contact voltage V2, so that the minority carrier electrons are stored in the diffusion D.

If injected holes are to be collected, the substrate A should be n doped. The accumulation diffusion D is of p+ type, and the voltages V1, V2 at the electrode contacts C1, C2 are such that the most negative voltage is applied to the contact C2 that is closest to the accumulation diffusion D. The voltages must be low enough so that a depletion zone extends from the semiconductor-oxide interface into the semiconductor substrate A. The potential of the accumulation diffusion D must be lower than the electrode contact voltage V2, so that the minority carrier holes are stored in the diffusion D.

Figure 11:
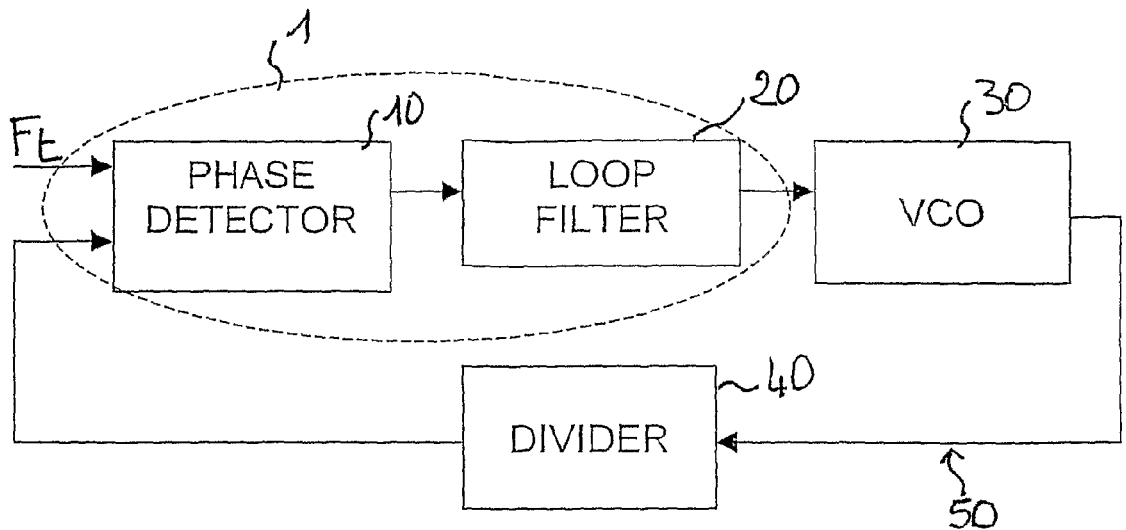
FIG. 11 shows a general phase-locked-loop circuit in which the demodulation device according to the invention is used for a phase-difference measurement.

The non-light sensitive demodulation device 1 according to the present invention is preferably used in a phase-locked-loop (PLL) circuit 50 as a phase-discriminating part, as shown in FIG. 11. By using an RC combination at the output of the demodulation device 1, a loop filter 20 and a phase detector 10 are combined. As known, the PLL circuit 50 comprises a voltage-controlled oscillator (VCO) 30 and a divider 40.

Figure 12:
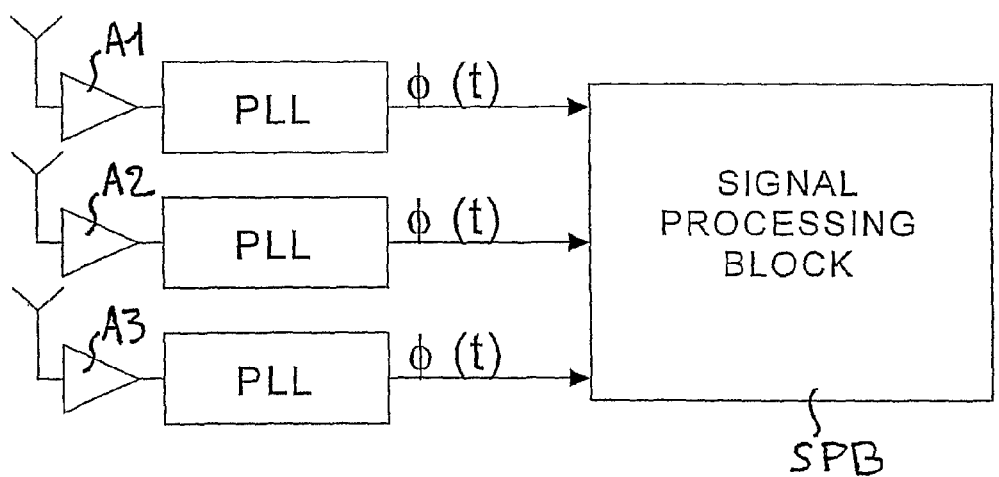
FIG. 12 shows a general array signal-processing circuit in which a phase-locked-loop circuit of FIG. 11 is used for a phase-difference measurement.

A further preferred use of the demodulation device 1 according to the invention is shown in FIG. 12. A receiver setup for an antenna array A1, A2, A3 uses PLL circuits PLL1, PLL2, PLL3, as designated by reference number 50 in FIG. 11, to track the phase of an incoming signal. A signal processing block SPB is adapted to process the signal using the phase information.

Another preferred use of the demodulation device 1 according to the present invention is schematically shown in FIG. 13. The on-chip implementation of a 3D-sensor comprises an additional calibration measurement usable in a system as depicted in FIG. 7. A two-dimensional sensor array comprises standard demodulation pixels DP10, DP11, DP12, DP13 providing the uncalibrated distance information based on the phase delay between the optical signal Popt(t–Tdist–Toffset) and the reference voltage signal Uref(t). An additional calibration row of non-photo-sensitive demodulation devices DD10, DD20, DD30, DD40 is provided. The inputs of these non-photo-sensitive demodulation devices DD10, DD20, DD30, DD40 are the reference voltage signal Uref(t) and the current signal of the LEDs. The resulting phase information is Toffset which is used for the calibration or error correction of the pixel measurements, respectively. A complete row of reference values enables furthermore the correction of any on-chip phase delays between the columns.

A further preferred use of the demodulation device 1 according to the present invention is illustrated in FIG. 14. FIG. 14 shows part of a two-dimensional array of photo-sensitive demodulation pixels. Each column of the array has its own temperature and delay-compensated demodulation signals which are generated by a local PLL circuit. The phase discriminator of the PLL circuit is based on the demodulation device DD100, . . . , DD105 according to the present invention.

This invention is not limited to the preferred embodiments described above, to which variations and improvements may be made, without departing from the scope of protection of the present patent.

LIST OF REFERENCE SIGNS

| | |
|---|---|
| 1 | Demodulation device |
| 1.1 | Current-injection stage |
| 1.2 | Sampling stage |
| 1.11 | Voltage-to-current converter |
| 1.12 | Current amplification module |
| 1.13 | External control |
| 1.21 | Charge drain |
| 1.22 | Fast switches module |
| 1.23 | Sample output stage |
| 1.230 | Accumulation module |
| 1.231 | Charge-to-voltage converter |
| 1.235 | Direct current-to-voltage converter |
| GC1 . . . GCn | Gate contacts |
| CIN | Current injection node |
| IN, IN1, IN10 | Injection nodes |
| C | Capacitor |
| S | Switch |
| PSD | Photosensitive diode |
| LS1, LS10 | Light shield |
| IS1, IS10 | Insulator |
| D1, D2, D10-D40 | Diffusion regions |
| GS1, GS10 | Gate structure |
| IG1, IG2, IG10-IG40 | Integration gates |
| DG1, DG2, DG10-DG40 | Decoupling gates |
| SUB1, SUB10 | Substrate |
| 10 | Phase detector |
| 20 | Loop filter |
| 30 | Voltage-controlled oscillator |
| 40 | Divider |
| 50 | Phase-locked-loop circuit |
| A1, A2, A3 | Antenna |
| PLL1, PLL2, PLL3 | Phase-locked loops |
| SPB | Signal-processing block |
| DP10-DP13 | Photo-sensitive demodulation pixels |
| DD10-DD100 | Demodulation devices |
| C1, C2 | Contacts |
| 3 | Gate |
| 31 | High-resistive material |
| 32 | Low-resistive material |
| V1, V2 | Voltages |
| A | Substrate |
| FG1, . . . | Floating gates |
| FI1, . . . | Floating implants |
| BC | Buried channel |

The invention claimed is:

1. A demodulation device (1) in a semiconductor substrate (SUB1) for the demodulation of a modulated electric signal, the demodulation device (1) comprising:
   an input node (CIN) for a modulated signal corresponding to the modulated electric signal,
   a sampling stage (1.2) for sampling the modulated signal at least two different time intervals within a modulation period, and
   at least two output nodes (D1, D2) for electric signals sampled in the sampling stage (1.2), wherein
   the sampling stage (1.2) comprises transfer means (GL, GM, GR) for transferring the modulated signal during each of the at least two time intervals from the input node (CIN) to one of the at least two output nodes (D1, D2) allocated to the respective time interval.

2. The demodulation device (1) according to claim 1, further comprising light-shielding means (LSI, LS1O) for shielding the device (1) from incident electromagnetic radiation, especially in the visible and near-infrared spectral range.

3. The demodulation device (1) according to claim 1, wherein an accumulation region (IG1, IG2) is allocated to each of the at least two output nodes (D1, D2), each accumulation region (IG1, IG2) being adapted to accumulate the signal transferred to the corresponding output node (D1, D2).

4. The demodulation device (1) according to claim 1, wherein the transfer means (GL, GM, GR) comprise a plurality of gate electrodes.

5. The demodulation device (1) according to claim 4, wherein the gate electrodes are CCD gate electrodes.

6. The demodulation device (1) according to claim 1, wherein the transfer means comprise a resistive electrode layer (GS1O) isolated from the semiconductor substrate (SUB1O) and at least two connections for applying an electric potential difference along the electrode layer (GS1O).

7. The demodulation device (1) according to claim 6, wherein the electrode layer (GS1O) has a dendritic or arborescent shape, and preferably its shape or its complementary shape is harp-like, comb-like, tree-like, snake-like, ice-crystal-like, or is a perforated plane.

8. The demodulation device (1) according to claim 6, wherein the electrode layer (GS1O) comprises a material (31) of one or more materials with different sheet resistances.

9. The demodulation device (1) according to claim 1, wherein the transfer means comprise at least one floating area (FG2, FG3, . . . ; FI2, FI3, . . . ) and at least two contact areas (FG1, FG7; FI1, FI7) provided with electric contacts (C1, C2) for applying an electric potential difference to said at least two contact areas (C1, C2), said contact areas (C1, C2) being electrically isolated from said at least one floating area (FG2, FG3, . . . ; FI2, FI3, . . . ) yet electrically coupled to at least one (FG2; FI2) of said at least one floating area (FG2, FG3, . . . ; FI2, FI3, . . . ).

10. The demodulation device (1) according to claim 9, wherein the transfer means comprise an arrangement of a plurality of floating areas (FG2, FG3, . . . ; FI2, FI3, . . . ), the arrangement being such that neighboring floating areas are electrically isolated from each other yet electrically coupled to each other.

11. The demodulation device (1) according to claim 1, further comprising control means for providing a control signal (Uref) by which the transfer means (GL, GM, GR) are synchronized with the modulated electric signal.

12. The demodulation device (1) according to claim 1, further comprising an injection stage (1.1) for generating a modulated charge-current signal corresponding to the modulated electric signal but decoupled from the modulated electric signal, an output of the injection stage (1.1) being connected to the input node (CIN).

13. The demodulation device (1) according to claim 12, wherein the injection stage (1.1) comprises a voltage-to-current converter (1.11) and/or a current amplifier (1.12).

14. The demodulation device (1) according to claim 1, further comprising a sample output stage (1.23) with a charge-to-voltage converter (1.231) for integrating charge carriers provided at the respective output node (GC1-GCn).

15. The demodulation device (1) according to claim 1, further comprising a sample output stage (1.23) with a current-to-voltage converter (1.235) for converting a charge-current signal provided at the respective output node (GC1-GCn).

16. A phase-locked-loop circuit (50) comprising:
   a phase-discriminating stage (10, 20) for providing a voltage output signal that is a measure of a phase difference of two electric input signals, a voltage-controlled oscillator (30) controlled by the output signal of the phase-discriminating stage (IQ, 20), and a feedback from the voltage-controlled oscillator (30) into the phase-discriminating stage (10, 20), the feedback comprising a divider (40), characterized in that the phase-discriminating stage comprises a demodulation device (1) according to any of the preceding claims.

17. A one- or two-dimensional array of detectors for phase-sensitively detecting and processing a plurality of signals, characterized in that each of the detectors comprises a phase-locked-loop circuit (PLL1-PLL3) according to claim 16.

18. Use of the demodulation device (1) according to claim 1 for the calibration, especially the compensation of temperature offsets, of a three-dimensional imaging system.

19. A three-dimensional imaging system, comprising:

a light source for illuminating a remote scene with modulated electromagnetic radiation (Popt(t)), the light source being drivable by an electric driving signal, a plurality of photosensitive demodulation pixels (DP1O, DPI1, . . . ) for sensing and demodulating a modulated electromagnetic-radiation signal, and control means (CB) for providing a modulated control signal to the plurality of demodulation pixels (DP1O, DPI1, . . . ), characterized by a demodulation device (DD1O, DD2O, . . . ) according to claim 1 for the demodulation of the electric driving signal.

20. The imaging system according to claim 19, wherein the demodulation pixels (DP1O, DPI1, . . . ) are arranged in rows and columns of a two-dimensional array, and one demodulation device is provided on each end of the columns, or one demodulation device (DD1O, DD2O, . . . ) is provided for each column.

21. Use of the phase-locked loop (50) according to claim 16 for the calibration, especially the compensation of temperature offsets, of a three-dimensional imaging system.

22. A sensor in a semiconductor substrate for the demodulation of a modulated optical signal, the sensor comprising:

at least one optical demodulation pixel for providing phase delay information between the modulated optical signal and a reference signal; and at least one non-photosensitive demodulation device comprising: an input node for a modulated electrical signal from an optical system generating the modulated optical signal, a sampling stage for sampling the modulated electrical signal from the input node at at least two different time intervals within a modulation period, and at least two output nodes for electric signals sampled in the sampling stage, wherein the sampling stage comprises transfer device for transferring the modulated electrical signal during each of the at least two time intervals from the input node to one of the at least two output nodes allocated to the respective time interval to generate calibration or error correction for measurements from the optical demodulation pixel.

23. The sensor according to claim 22, further comprising light-shield for shielding the at least one non-photosensitive demodulation device from incident electromagnetic radiation.

24. The sensor according to claim 22, wherein an accumulation region is allocated to each of the at least two output nodes, each accumulation region being adapted to accumulate the signal transferred to the corresponding output node.

25. The sensor according to claim 22, wherein the transfer device comprises a plurality of gate electrodes.

26. The sensor according to claim 25, wherein the gate electrodes are CCD gate electrodes.

27. The sensor according claim 22, further comprising a controller for providing the reference signal by which the transfer device is synchronized with the modulated electric signal.

28. The sensor according claim 22, further comprising an injection stage for generating a modulated charge-current signal corresponding to the modulated electrical signal but decoupled from the modulated electrical signal, an output of the injection stage being connected to the input node.

29. The sensor according to claim 28, wherein the injection stage comprises a voltage-to-current converter and/or a current amplifier.

30. The sensor according claim 22, further comprising a sample output stage with a charge-to-voltage converter for integrating charge carriers provided at the respective output node.

31. The sensor according claim 22, further comprising a sample output stage with a current-to-voltage converter for converting a charge-current signal provided at the respective output node.

\* \* \* \* \*

UNITED STATES PATENT AND TRADEMARK OFFICE
CERTIFICATE OF CORRECTION

PATENT NO. : 7,671,671 B2
APPLICATION NO. : 12/090433
DATED : March 2, 2010
INVENTOR(S) : Bernhard Buettgen et al.

It is certified that error appears in the above-identified patent and that said Letters Patent is hereby corrected as shown below:

In Claim 1, in Column 13, Line 57, insert --at-- before the word "least."

Signed and Sealed this

Thirtieth Day of March, 2010

David J. Kappos
*Director of the United States Patent and Trademark Office*